United States Patent
Meunier-Bellard et al.

(10) Patent No.: US 8,202,782 B2
(45) Date of Patent: Jun. 19, 2012

(54) METHOD OF MANUFACTURING TRANSISTOR

(75) Inventors: Philippe Meunier-Bellard, Kortenberg (BE); Anco Heringa, Waalre (NL); Johannes Donkers, Valkenswaard (NL)

(73) Assignee: NXP B.V., Eindhoven (NL)

( * ) Notice: Subject to any disclaimer, the term of this patent is extended or adjusted under 35 U.S.C. 154(b) by 159 days.

(21) Appl. No.: 12/676,017

(22) PCT Filed: Aug. 29, 2008

(86) PCT No.: PCT/IB2008/053496
§ 371 (c)(1),
(2), (4) Date: Mar. 2, 2010

(87) PCT Pub. No.: WO2009/031085
PCT Pub. Date: Mar. 12, 2009

(65) Prior Publication Data
US 2010/0176426 A1      Jul. 15, 2010

(30) Foreign Application Priority Data
Sep. 5, 2007   (EP) .................................. 07115714

(51) Int. Cl.
*H01L 21/336* (2006.01)
(52) U.S. Cl. ................ 438/303; 257/401; 257/E21.626; 257/900; 438/184
(58) Field of Classification Search .................. 257/530, 257/E21.336, 288, 401, 900, E21.626, E21.64; 438/760, 632, 648, 184, 230, 303, 596
See application file for complete search history.

(56) References Cited

U.S. PATENT DOCUMENTS

| | | | |
|---|---|---|---|
| 4,713,356 A | 12/1987 | Hiruta | |
| 4,755,479 A * | 7/1988 | Miura | 438/303 |
| 5,424,571 A | 6/1995 | Liou | |
| 5,501,997 A * | 3/1996 | Lin et al. | 438/303 |
| 5,518,944 A | 5/1996 | Hiroki et al. | |
| 5,631,174 A * | 5/1997 | Iyer | 438/769 |
| 5,652,159 A | 7/1997 | Hirano | |
| 5,656,556 A | 8/1997 | Yang | |
| 5,663,591 A * | 9/1997 | Iranmanesh | 257/530 |
| 5,763,301 A * | 6/1998 | Rha et al. | 438/149 |
| 5,811,342 A | 9/1998 | Wu | |
| 5,915,175 A | 6/1999 | Wise | |
| 5,953,615 A | 9/1999 | Yu | |
| 5,960,315 A * | 9/1999 | Gambino et al. | 438/632 |

(Continued)

FOREIGN PATENT DOCUMENTS

DE     2460967 A1     7/1976

(Continued)

OTHER PUBLICATIONS

Kang-Kyu Choi, et al; "Untrathin-body SOI MOSFET for Deep-Sub-Tenth Micron Era"; IEEE Electron Device Letters; IEEE Service Center, New York, NY, US; vol. 21, No. 5; May 1, 2005.

*Primary Examiner* — William F Kraig

(57) ABSTRACT

A method of manufacturing a transistor (300), the method comprising forming a gate (101) on a substrate (102), forming a spacer (201) on lateral side walls of the gate (101) and on an adjacent portion (202) of the substrate (102), modifying material of the spacer (201) so that the modified spacer (301) covers only a lower portion (303) of the lateral side walls of the gate (101), and providing source/drain regions (301) in the modified spacer (301).

9 Claims, 7 Drawing Sheets

U.S. PATENT DOCUMENTS

| | | | |
|---|---|---|---|
| 6,054,356 A | 4/2000 | Dawson et al. | |
| 6,063,676 A | 5/2000 | Choi et al. | |
| 6,187,642 B1 | 2/2001 | Yu et al. | |
| 6,208,008 B1 * | 3/2001 | Arndt et al. | 257/510 |
| 6,238,988 B1 | 5/2001 | Hsiao et al. | |
| 6,351,013 B1 * | 2/2002 | Luning et al. | 257/368 |
| 6,492,665 B1 | 12/2002 | Akamatsu et al. | |
| 2002/0009897 A1 * | 1/2002 | Srinivasan | 438/760 |
| 2003/0194851 A1 * | 10/2003 | Johnson et al. | 438/585 |
| 2004/0262650 A1 | 12/2004 | Iwata et al. | |
| 2005/0167765 A1 * | 8/2005 | Hokazono | 257/408 |
| 2006/0194398 A1 | 8/2006 | Oishi et al. | |
| 2007/0298549 A1 * | 12/2007 | Jurczak et al. | 438/149 |

FOREIGN PATENT DOCUMENTS

| | | |
|---|---|---|
| EP | 0422824 A1 | 4/1991 |
| EP | 0671760 A2 | 9/1995 |
| EP | 1478029 A1 | 11/2004 |
| JP | 59208784 A | 11/1984 |
| JP | 60059777 A | 4/1985 |
| JP | 61267368 A | 11/1986 |
| JP | 04142747 A | 5/1993 |
| JP | 10270375 A | 10/1998 |
| JP | 2000049332 A | 2/2000 |
| KR | 20050059633 | 6/2005 |
| WO | 9930361 A1 | 6/1999 |

* cited by examiner

METHOD OF MANUFACTURING TRANSISTOR

FIELD OF THE INVENTION

The invention relates to a transistor.

Moreover, the invention relates to a method of manufacturing a transistor.

BACKGROUND OF THE INVENTION

The aggressive gate length downscaling in CMOS technology for logical applications may allow that a CMOS transistor could now reach a frequency domain, which was previously reserved for bipolar transistors.

A MOSFET device may be considered to be short when the channel length is in the same order of magnitude as the depletion layer width of the source and drain junction. As the channel length may be reduced to increase both the operation speed and the number of components per chips, so-called short channel effects may arise which implied that the transistors are becoming more and more leaky.

When the depletion region surrounding the drain extends to the source (so that the two depletion layers merge), leakage or punch-through may occur which can be reduced or minimized in different ways like with the use of thinner gate oxide layers, larger substrate doping, shallower junctions, and with a longer channel. The use of raised source/drain is also an efficient way to improve with respect to the short channel effects, because it allows more shallow source/drains. It is also possible to reduce the series resistance of source/drain regions with elevated source/drains. This technique usually requires selective epitaxy growth which is difficult to implement in a production environment.

For the scaling, that is reduction in size, of devices in integrated circuits, all dimensions have to be reduced. As a consequence the junction depth has to be reduced. This reduction of depth should not reduce the conductivity of the source/drain regions from the channel edge to the source/drain contacts. Increasing the doping level of the source/drain areas enhances the conductivity but also enhances the electric field at these junctions including higher leakage and lower breakdown voltages of these junctions. Both latter effects are detrimental for further scaling. Therefore, it is desirable to have a device in which the dimensions are reduced, and simultaneously the doping levels are increased, but on the other hand it is desired to limit the resulting field increase as much as possible.

Curvature of junctions includes high electric fields at these curved junctions: The lower the radius the higher the field. With decreasing dimensions, the radius goes down so the field goes up. If one could avoid or reduce the junction curvature (this lower curvature results in a larger effective radius), the electric field would go up less with the ever increasing doping levels.

Shaping a gradually increasing source/drain extension depth by using a number of implants with varying implant tilts or growing elevated source/drains may remedy the excessive increase of the electric field due to the scaling, but may be expensive. Such a multiple implant method is not only expensive, but may also implant part of the extension through the gate oxide. This may harm the gate oxide integrity. The elevated source/drain by epitaxial growth is not only expensive but also induces extra source/gate, drain/gate and source/drain capacitances which may be problematic for high frequency operation.

U.S. Pat. No. 5,953,615 discloses MOSFETs with deep source/drain junctions and shallow source/drain extensions, and provides on a semiconductor wafer a gate stack with side spacers. The side spacers are etched so that a known thickness of the side spacers is left. An ion beam is used to implant Si+ or Ge+ or Xe+ to amorphize the silicon region, creating an amorphous region with two different depths. A high dose ion beam is then used to implant a dopant. An oxide layer is then deposited as a barrier layer, and then a metal layer is deposited to improve laser energy absorption. Laser annealing is used to melt the amorphous silicon region which causes the dopant to diffuse in and into the amorphous silicon region creating deep source/drain junctions and shallow source/drain extensions. Standard techniques are then used to complete the transistor, which includes silicidation of the source/drain junctions.

However, such transistor manufacture procedures may be cumbersome and expensive.

OBJECT AND SUMMARY OF THE INVENTION

It is an object of the invention to provide a scalable transistor architecture which can be manufactured with reasonable effort.

In order to achieve the object defined above, a transistor, and a method of manufacturing a transistor according to the independent claims are provided.

According to an exemplary embodiment of the invention, a method of manufacturing a transistor is provided, the method comprising forming a gate on a substrate, forming a spacer on lateral side walls of the gate (that is walls of the gate being perpendicular to a main surface of the substrate) and on an adjacent portion of the substrate (more precisely on a surface portion of the substrate which surface portion is directly neighboured to the gate), modifying material of the spacer (that is modifying a spatial distribution of material of the spacer and/or removing part of the spacer, for instance by etching) so that the modified spacer covers only a lower portion of the lateral side walls of the gate (that is a portion of the lateral side wall which is closer or adjacent to the substrate), and providing source/drain regions in the modified spacer.

According to another exemplary embodiment of the invention, a transistor is provided, the transistor comprising a substrate, a gate on the substrate, a spacer (for instance rearranged in accordance with the above described method) which covers only a lower portion of lateral side walls of the gate and a portion of the substrate, and source/drain regions in the spacer.

The term "substrate" may denote any suitable material, such as a semiconductor, glass, plastic, etc. According to an exemplary embodiment, the term "substrate" may be used to define generally the elements for layers that underlie and/or overlie a layer or portions of interest. Also, the substrate may be any other base on which a layer is formed, for example a semiconductor wafer such as a silicon wafer or silicon chip.

The transistor may be a field effect transistor. The term "field effect transistor" (FET) may denote a transistor in which an output current (source-drain current) may be controlled by the voltage applied to a gate which can be an MOS structure (MOSFET), a p-n junction (JFET), or metal-semiconductor contact (MESFET). A FET is a unipolar transistor, that is current is controlled by majority carriers only.

The term "source/drain region" may particularly denote a source region or a drain region. Since the functionality of a source region and a drain region may depend on the operation mode of a (memory or logic) transistor, for instance voltages applied thereto, the term source/drain region may denote a structure which can act as a source region or as a drain region.

The term "gate" may denote an electrically conductive structure to which an electric voltage may be applied to control a conductivity of a channel region of a semiconductor substrate. In the context of this application, the term gate may cover such an electrically conductive structure individually, or the electrically conductive structure with at least one electrically insulating component connected thereto. Thus, also a gate stack may be covered by the term "gate".

The term "modifying" may particularly denote any treatment by which the configuration of spacer material is altered along the lateral walls of the gate stack. Such a modification may be performed with or without adding material to the spacer and with (for instance etching) or without (for instance annealing SiGe material in hydrogen atmosphere) removing material from the spacer.

The term "rearranging" may particularly denote any treatment by which spacer material is migrated, moved or transferred along the lateral walls of the gate stack. Such a rearrangement may be performed essentially without adding material to the spacer and essentially without removing material from the spacer.

The term "concave" may particularly denote curved downwards, when seen from the top of the layer sequence.

The term "convex" may particularly denote curved upwards, when seen from the top of a layer sequence.

According to an exemplary embodiment of the invention, a spacer is provided on a side wall of a gate stack for the purpose to obtain a slanted source/drain region by first forming a spacer conventionally on a lateral sidewall of a gate stack, and by subsequently migrating material of this spacer to thereby move part of the material to a lower portion of the substrate, thereby forcing it to cover a larger area on the substrate and a smaller area on the lateral walls of the gate stack. By taking this measure, an elevated source/drain may be provided which suffers less from problems occurring when scaling devices down, especially the high source/drain resistances are remedied.

According to an exemplary embodiment, an elevated source/drain formation without selective epitaxy may be provided. Making a raised source/drain MOSFET without the use of selective epitaxy may allow a better source/drain engineering that improves the short channel effects and especially the punch through effect and the breakdown voltage and still have a low source and drain series resistance. The breakdown voltage can also be improved because a low curvature of the junction may result from the processing according to an exemplary embodiment of the invention. This allows the fabrication of transistors for high frequency applications (comparable to the mainstream CMOS) and allows to improve breakdown voltage (higher than the mainstream CMOS) to make the transistor suitable for "RF power" applications. The combination of a shallow junction depth at the channel edge gradually going deeper induces a good breakdown voltage, a good (that is low) source/drain resistance and good gate length scaling characteristics. The higher breakdown voltage can be exploited for higher reliability or for higher operating voltages, for instance in analog applications.

A MOSFET gate length downscaling may enhance the high frequency operation but may also increase short channel effects. RF power applications may require transistors able to deliver high frequency and a decent power output (or breakdown). The raised source/drain structures reduce the short channel effects and punch through without degrading (too much) the frequency operations of the transistors. By avoiding a fabrication of transistors with selective epitaxial growth, embodiments of the invention allow to make an elevated source/drain structure in a standard mainstream CMOS without the use of selective epitaxy and still having the benefit of the lower series resistance.

According to an exemplary embodiment of the invention, it is possible to create a spacer at the gate edge with gradually decreasing thickness from gate edge with an adequate shape. In one embodiment, the spacer layer is an amorphous Si(Ge) layer, which is reshaped and used as well as elevated source drain after solid phase epitaxial regrowth (which is a cheap flexible method of manufacturing). The latter combines the advantage of elevated source/drain with an attractive shape of the source/drain junction.

Next, further exemplary embodiments of the method will be explained. However, these embodiments also apply to the transistor.

The method may comprise implanting the source/drain regions in the modified (for instance rearranged) spacer. In one embodiment, the rearranged spacer itself may be used as raised source/drain regions which then may make it necessary to implant dopant into the spacer. In this embodiment, the spacer remains on the layer sequence.

The method may comprise forming the source/drain regions in the modified (for instance rearranged) spacer which may be made of an already doped material. In such an embodiment, the implantation may become dispensable, since in situ doped material may be used for manufacturing the spacer, or implantation may be performed during manufacture (for example deposition) of the spacer. The modifying may comprise rearranging the material of the spacer so that the rearranged spacer covers only a lower portion of the lateral side walls of the gate and an increased portion of the substrate. In such an embodiment, essentially without loss of material, the material may simply be migrated towards the substrate and away from a center of the gate stack.

The method may further comprise rearranging the material of the spacer by annealing, particularly by hydrogen annealing (that is annealing in hydrogen atmosphere). Such a procedure may be performed at a temperature in a range of, for example, 600° C. to 1000° C., at a pressure in a range of, for example, 1 Torr to 100 Torr, and for a time in a range of, for instance, 10 seconds to 10 minutes. This may allow to force the material of the spacer to migrate or to sink towards the surface of the substrate, thereby allowing to control an extent to which an upper portion of the lateral sidewall of the gate stack is free of the spacer after the rearranging procedure. Therefore, it may be achieved that not the entire sidewall of the gate stack remains covered with the material of the rearranged spacer, so that the thickness variation of the source/drain region is not too extreme, yielding a smooth transition of the depth of the source/drain regions. By adjusting the parameters of the rearrangement procedure, for instance the time interval during which the layer sequence is made subject to the annealing procedure, an amount of rearranging/migrating may be controlled with high precision. The modifying may comprise etching back part of the material of the spacer. By such a back etch, the thickness of the spacer may be reduced in a vertical direction, thereby allowing to obtain a back etched source/drain structure having advantageous properties for the transistor performance (see FIG. 4).

The method may comprise modifying (for instance rearranging) the material of the spacer with a thickness which gradually increases towards the gate. Therefore, an essentially stepless doping profile may be obtained in the source/drain regions.

The method may comprise forming a protection structure, particularly an essentially L-shaped protection structure (see reference numeral 901), between the gate and the spacer. The term "L-shaped" may denote a shape of the protection structure in a cross-sectional view of the layer sequence which may result in an appearance of the protection structure to have the shape of two letters "L" at the two lateral sidewalls of the gate stack visible in such a cross-sectional view. Such a protection structure may protect the gate stack against possibly chemically aggressive material of the spacer, thereby ensuring a high quality of the manufactured transistor.

The method may comprise forming the spacer on the lateral sidewalls of the gate and on the adjacent portion of the substrate by (for instance conformally) depositing spacer material over the gate and the substrate, and subsequently removing (for instance by etching) part of the spacer material so that the spacer remains only on lateral sidewalls of the gate and on the adjacent portions of the substrate. Thus, a conformal deposition of the spacer material, for instance SiGe, may be followed by an etching procedure which forms essentially convex spacers at the lateral sidewalls of the gate stack. Subsequently, the rearrangement may convert this convex structure into a concave structure, for example by annealing.

In the following, further exemplary embodiments of the transistors will be explained. However, these embodiments also apply to the method.

The spacer may have a concave shape. Thus, after the rearrangement, the shape of the spacer may be concave in a similar manner as an avalanche which has slipped down or glided down a hill. The extent to which the material has been rearranged then also has an impact on the curvature of the concave spacer.

The spacer may comprise a material of the group consisting of silicon-germanium (SiGe) and silicon. Silicon-germanium may be a preferred choice since this may be rearranged efficiently by hydrogen annealing.

The transistor may comprise a further spacer on a lateral wall of the gate, essentially (that is at least to a main part) above the spacer, and having a thickness smaller than the thickness of the spacer. This additional spacer may prevent silicidation bridging between the source/drain regions and a polysilicon gate.

The further spacer may be a convex spacer. Thus, the transistor may comprise a concave spacer used as a source/drain region or for defining a design of the source/drain regions in the substrate, and may comprise a further concave spacer for protection purposes. The further spacer may have a height which is higher than the height of the spacer, but may have a width which is smaller than the width of the spacer.

A raised source/drain structure according to an exemplary embodiment of the invention may be obtained by the formation of a SiGe spacer and the use of silicon migration. Such a concept may involve the following measures:
  make a silicon nitride L-shaped spacer after the gate patterning to protect the poly gate
  make a SiGe spacer
  promote a SiGe migration during a hydrogen annealing in order to "spread" the SiGe layer on the source/drain regions
  use a standard CMOS spacer in order to prevent silicidation bridging between the source/drain and the poly gate.

According to an exemplary embodiment, an amorphous silicon etch (as shown for instance in FIG. 10) may be omitted, since it is not mandatory.

Embodiments of the invention are applicable to crystalline silicon wafers. Other embodiments are applicable on SOI (Silicon On Insulator) wafers. However, the silicon migration may also occur on the top silicon or on top of the box oxide. A hydrogen anneal of 800° C. may be applied to SOI wafers with silicon layers as thin as 8 nm. Lower hydrogen anneal temperatures may be used by increasing the Ge concentration and decreasing the oxide thickness under the SiGe layer. The SiGe spacer may be replaced by a dummy gate.

Exemplary embodiments of the invention may be applied to any CMOS application allowing low source/drain resistance with shallow junctions at the channel edge allowing proper length scaling and also in CMOS applications requiring higher operating voltages such as in RF power CMOS.

According to an exemplary embodiment, it may be possible to create a slanted shape of the source/drain extension, so that shape controlling may be performed particularly with a hydrogen annealing. This is an elegant way of making a slanted source/drain extension boundary.

According to an exemplary embodiment of the invention, after rearranging, a vertical thickness of the rearranged spacer is smaller than a vertical thickness of the gate stack. Since after rearranging, only a portion of the lateral sidewall of the gate stack is covered with the rearranged material of the spacer, it is possible to allow for tuning of the absorption thickness at the gate edge and tuning of its width.

The device may be manufactured in CMOS technology. Any CMOS technology generation may be used. When using CMOS technology, a known and cheap method may be used for manufacturing the transistor.

The substrate may be a semiconductor substrate. The transistor device may be monolithically integrated in the semiconductor substrate, particularly comprising one of the group consisting of a group IV semiconductor (such as silicon or germanium), and a group III-group V semiconductor (such as gallium arsenide).

For any method step, any conventional procedure as known from semiconductor technology may be implemented. Forming layers or components may include deposition techniques like CVD (chemical vapour deposition), PECVD (plasma enhanced chemical vapour deposition), ALD (atomic layer deposition), or sputtering. Removing layers or components may include etching techniques like wet etching, plasma etching, etc., as well as patterning techniques like optical lithography, UV lithography, electron beam lithography, etc.

Embodiments of the invention are not bound to specific materials, so that many different materials may be used. For conductive structures, it may be possible to use metallization structures, silicide structures or polysilicon structures. For semiconductor regions or components, crystalline silicon may be used. For insulating portions, silicon oxide or silicon nitride may be used.

The transistor may be formed on a purely crystalline silicon wafer or on an SOI wafer (Silicon On Insulator).

Any process technologies like CMOS, BIPOLAR, BIC-MOS may be implemented.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

FIG. 1, FIG. 2 and FIG. 4 show layer sequences obtained during a method of manufacturing a transistor according to an exemplary embodiment of the invention.

DESCRIPTION OF EMBODIMENTS

Figure 1:
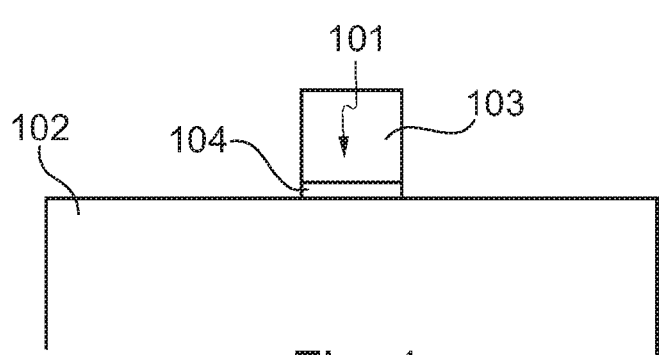
FIG. 1 to FIG. 3 show layer sequences obtained during a method of manufacturing a transistor according to an exemplary embodiment of the invention.

The illustration in the drawing is schematical. In different drawings, similar or identical elements are provided with the same reference signs.

In the following, referring to FIG. 1 to FIG. 3, a method of manufacturing a transistor 400 according to an exemplary embodiment of the invention will be explained.

As can be taken from a layer sequence 100 shown in FIG. 1, a gate stack 101 is formed on a silicon substrate 102. The gate stack 101 comprises a poly silicon gate 103 and a gate oxide layer 104. The gate oxide layer 104 may be deposited as a silicon oxide layer on the silicon substrate 102 or may be formed by thermally oxidizing the silicon material at the surface of the silicon substrate 102. A poly silicon layer may be deposited on top of the gate oxide layer 104 and may be patterned using a lithography to obtain the laterally confined gate 103.

Figure 2:
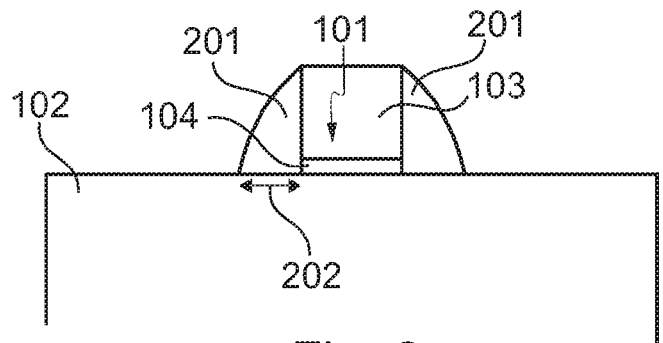

In order to obtain a layer sequence 200 shown in FIG. 2, a spacer 201 is formed on entire lateral sidewalls of the gate stack 101 and on an adjacent portion 202 of the substrate 102.

The spacer 201 may be made of silicon-germanium material (as will be described in more detail referring to the embodiment shown in FIG. 5 to FIG. 22).

Figure 3:
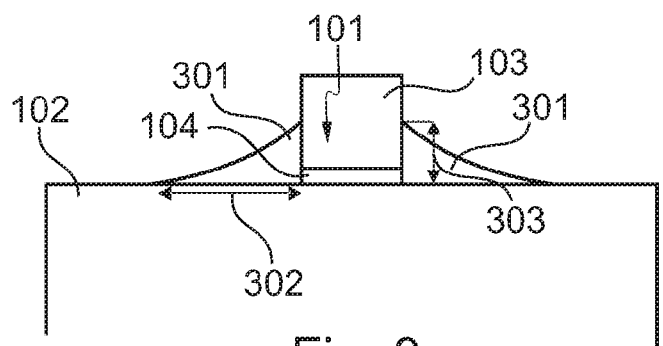

In order to obtain a layer sequence 300 shown in FIG. 3, material of the spacer 201 is rearranged by thermally annealing the layer sequence 200 in hydrogen atmosphere, so that the rearranged spacer 301 covers only a lower sub-portion 303 of the lateral sidewalls of the gate stack 101 and an increased portion 302 of the substrate 102, as compared to the layer sequence 200. Furthermore, a convex geometry of the spacer 201 is converted into a concave geometry of the rearranged spacer 301.

FIG. 3 shows a transistor 300 according to an exemplary embodiment of the invention, in which the rearranged spacers 301 form raised source-/drain regions.

With the embodiment shown in FIG. 3, it is possible that the rearranged spacers 301 are directly used as source/drain regions, which may then require that they are doped (for instance in situ or by implantation).

Figure 4:
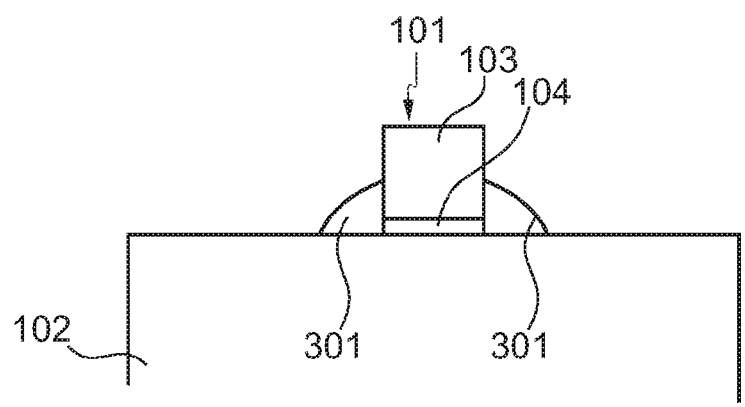

A transistor 400 shown in FIG. 4 can be manufactured based on the layer sequence 200 shown in FIG. 2 by etching back part of the material of the spacer 201.

With the embodiment shown in FIG. 4, it is possible that the back etched spacers 301 are directly used as source/drain regions, which may then require that they are doped (for instance in situ or by implantation).

In the following, referring to FIG. 5 to FIG. 22, a method of manufacturing a transistor according to an exemplary embodiment of the invention will be explained. The thicknesses of layers mentioned in the following are specified only for giving an exemplary order of magnitude, and exact thicknesses can vary from the given thicknesses. Thus, thickness values are only exemplary and may vary over broad ranges.

Figure 5:
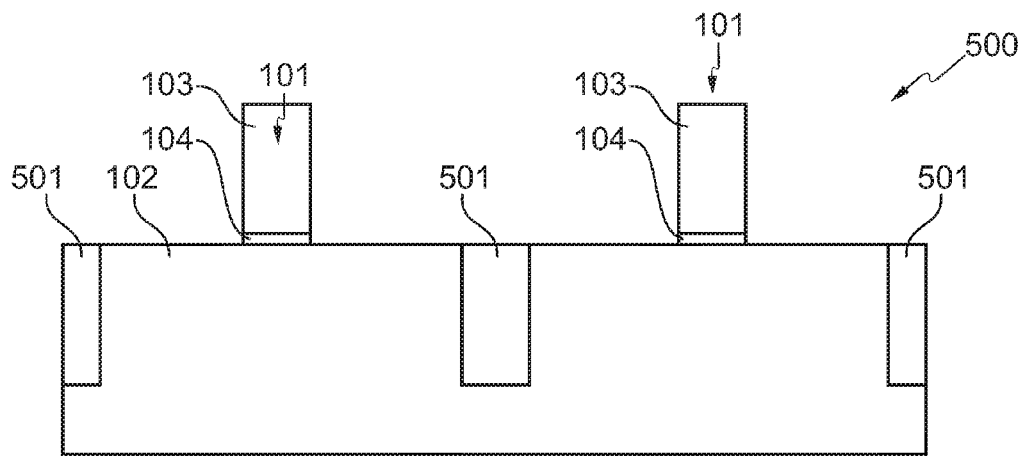
FIG. 5 to FIG. 22 show layer sequences obtained during another method of manufacturing a transistor according to an exemplary embodiment of the invention.

In order to obtain a layer sequence 500 shown in FIG. 5, STI (shallow trench isolation) structures 501 are formed in a silicon substrate 102. Gate stacks 101 are formed comprising a gate insulation layer 104 and a poly silicon gate 103.

Figure 6:
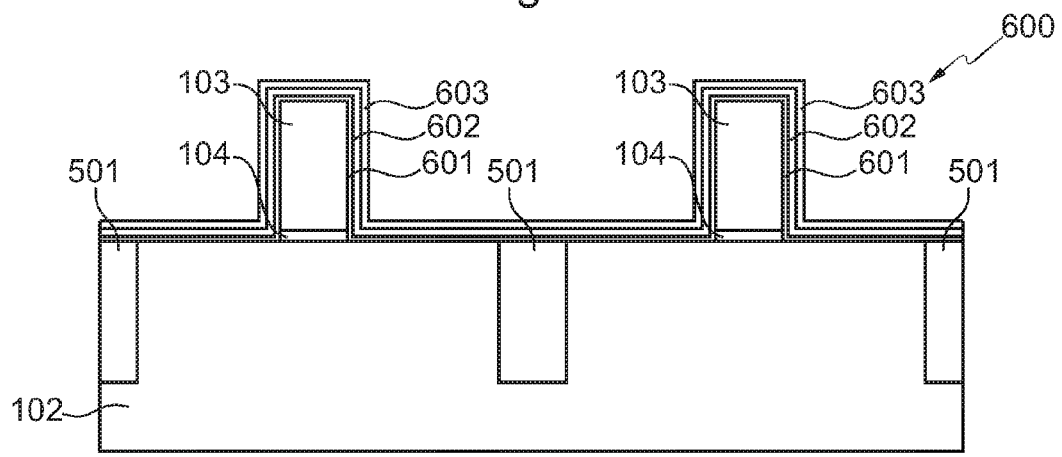

In order to obtain a layer sequence 600 shown in FIG. 6, a silicon oxide layer 601, for instance having a thickness of 3 nm, a silicon nitride layer 602 having a thickness of 5 nm, and an amorphous silicon layer 603 having a thickness of 5 nm are deposited on the layer sequence 500.

Figure 7:
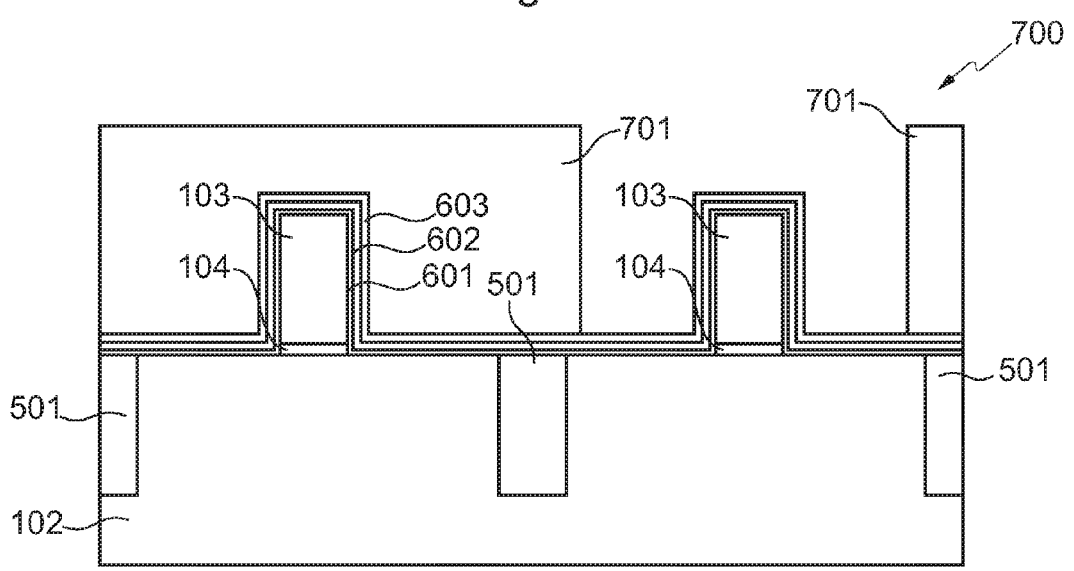

In order to obtain a layer sequence 700 shown in FIG. 7, a photoresist layer 701 is spun over the layer sequence 600, and a lithography is performed in order to expose the portion of the layer sequence 600 on which a transistor according to an exemplary embodiment of the invention shall be formed.

Figure 8:
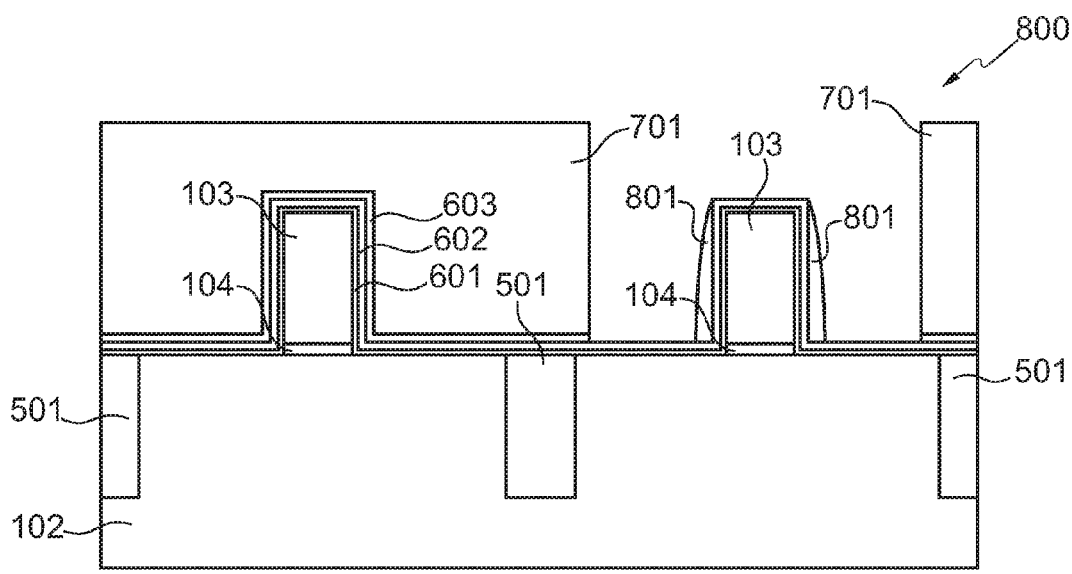

In order to obtain a layer sequence 800 shown in FIG. 8, an a-Si spacer formation is performed by removing an exposed portion of the silicon layer 603 resulting in the formation of silicon spacers 801.

Figure 9:
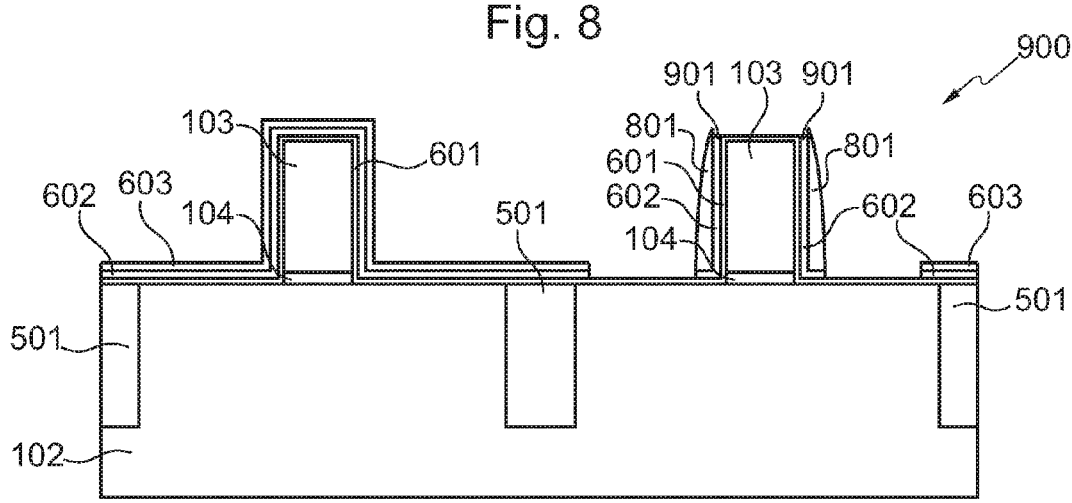

In order to obtain a layer sequence 900 shown in FIG. 9, the resist 701 is stripped and a silicon nitride etch is performed. This removes exposed surface portions of the silicon nitride layer 602. As can be taken from FIG. 9, the remaining portions of the silicon nitride layer 602 on the gate stack on the right-hand side of FIG. 9 form essentially L-shaped spacers 901.

Figure 10:
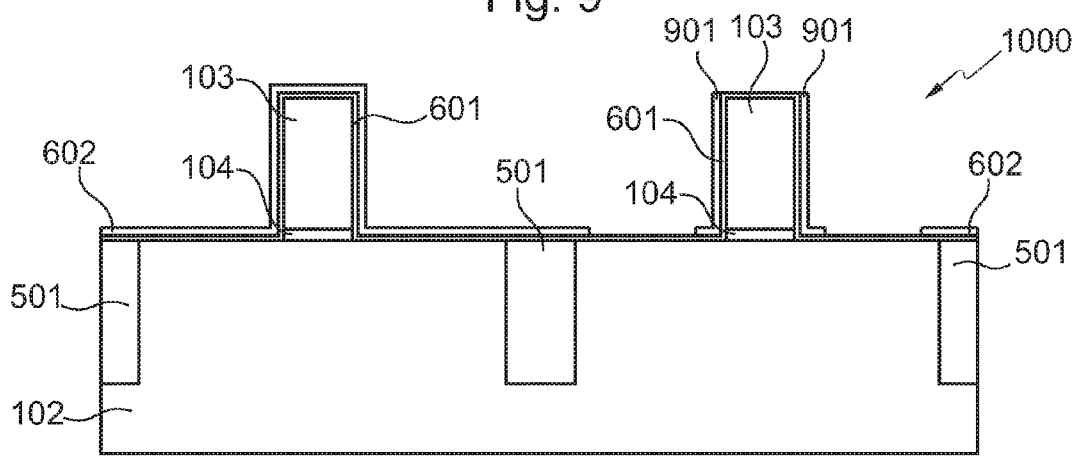

In order to obtain a layer sequence 1000 shown in FIG. 10, an a-Si etch is performed thereby removing remaining portions of the silicon material 603, 801 exposed in FIG. 9.

Figure 11:
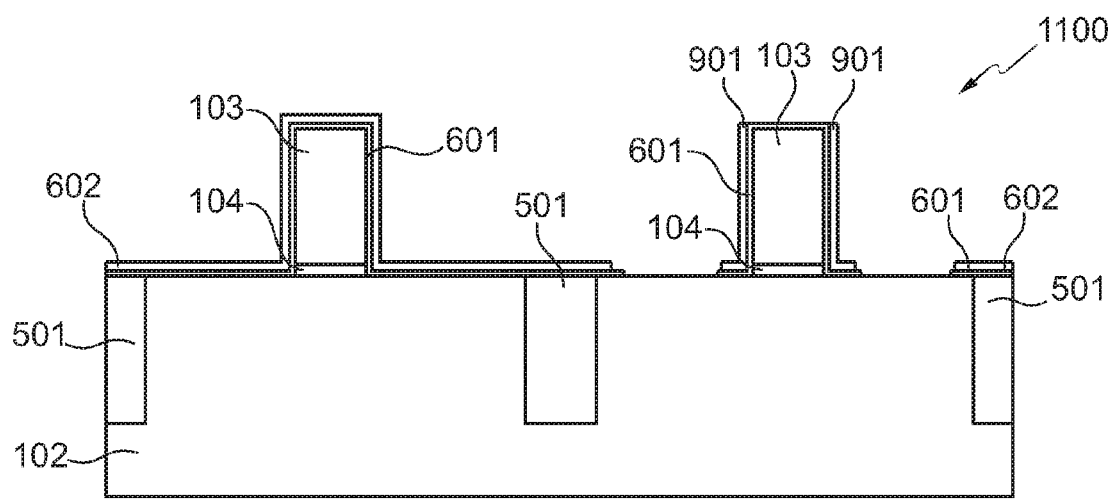

In order to obtain a layer sequence 1100 shown in FIG. 11, a silicon oxide etch is performed to remove exposed portions of the layer 601.

Figure 12:
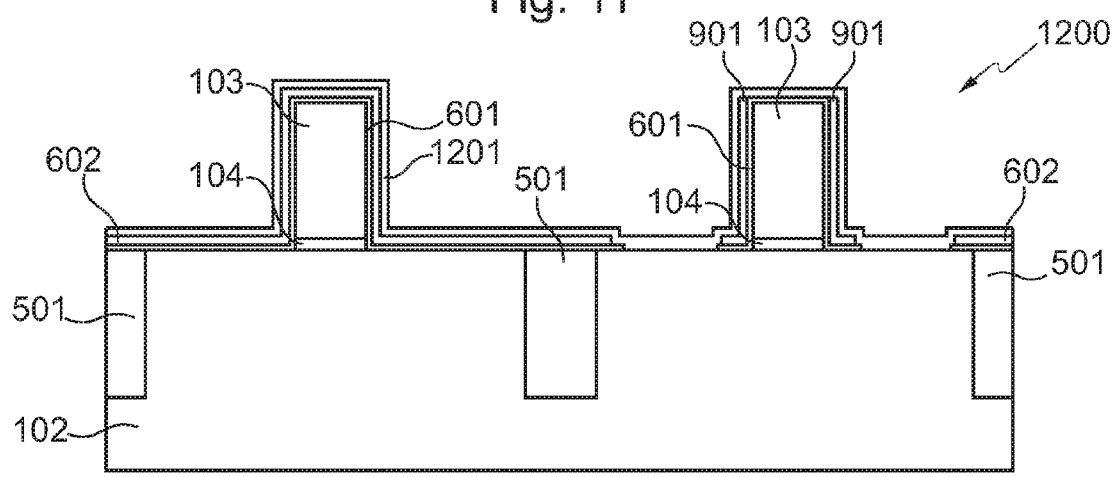

In order to obtain a layer sequence 1200 shown in FIG. 12, a silicon oxide layer 1201 having a thickness of for instance 5 nm is deposited over the layer sequence 1100.

Figure 13:
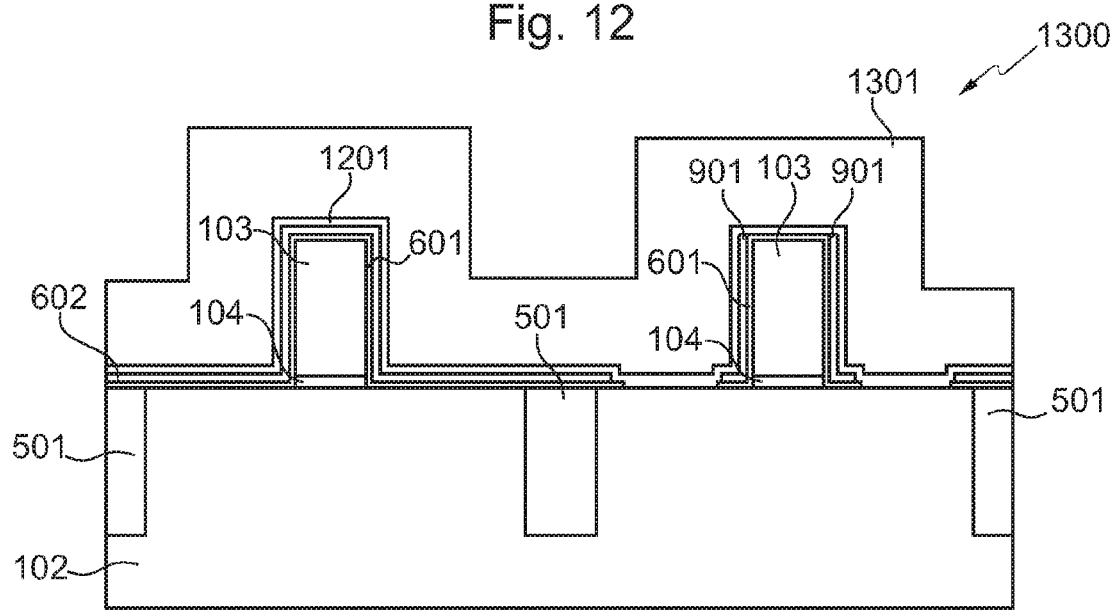

In order to obtain a layer sequence 1300 shown in FIG. 13, a-SiGe is deposited over the layer sequence 1200, thereby forming a conformal SiGe layer 1301.

Figure 14:
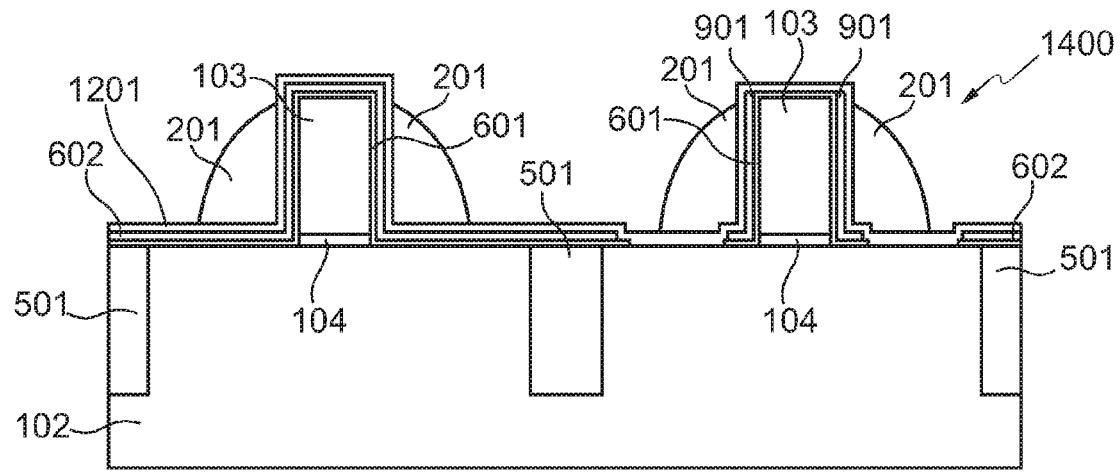

In order to obtain a layer sequence 1400 shown in FIG. 14, the SiGe layer 1301 is etched to form a-SiGe spacers 201.

Figure 15:
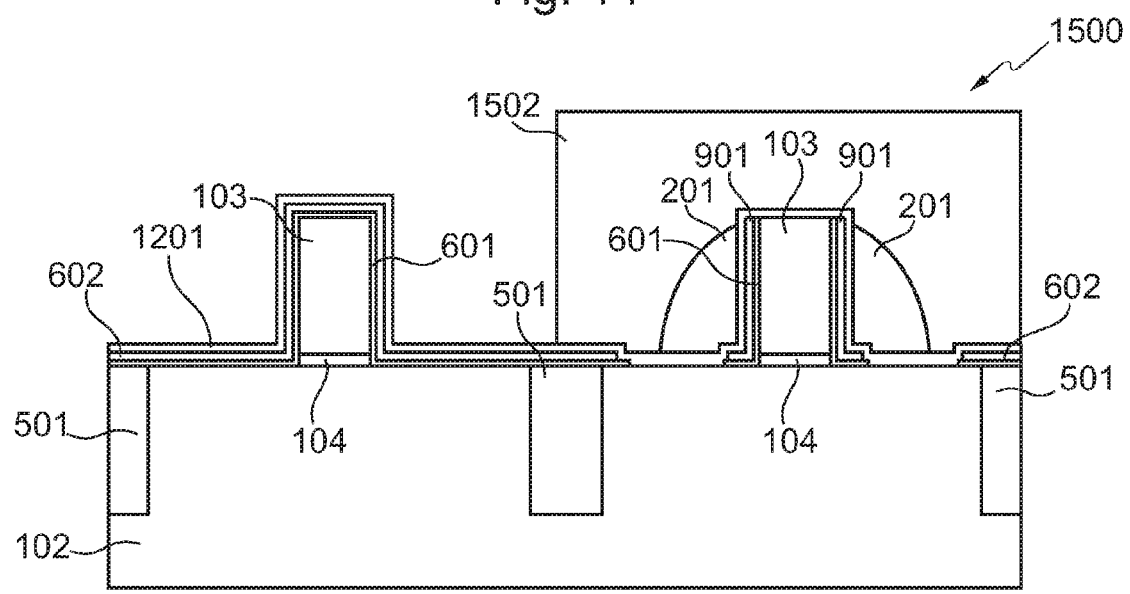

In order to obtain a layer sequence 1500 shown in FIG. 15, a photoresist 1502 is spun, and a lithography is performed to maintain only a portion of the layer sequence 1400 covered with photoresist 1502 on which portion the transistor according to an exemplary embodiment of the invention shall be formed. Subsequently, an a-SiGe etch is performed in order to remove the spacer 201 on the gate stack on the left-hand side of FIG. 15.

Figure 16:
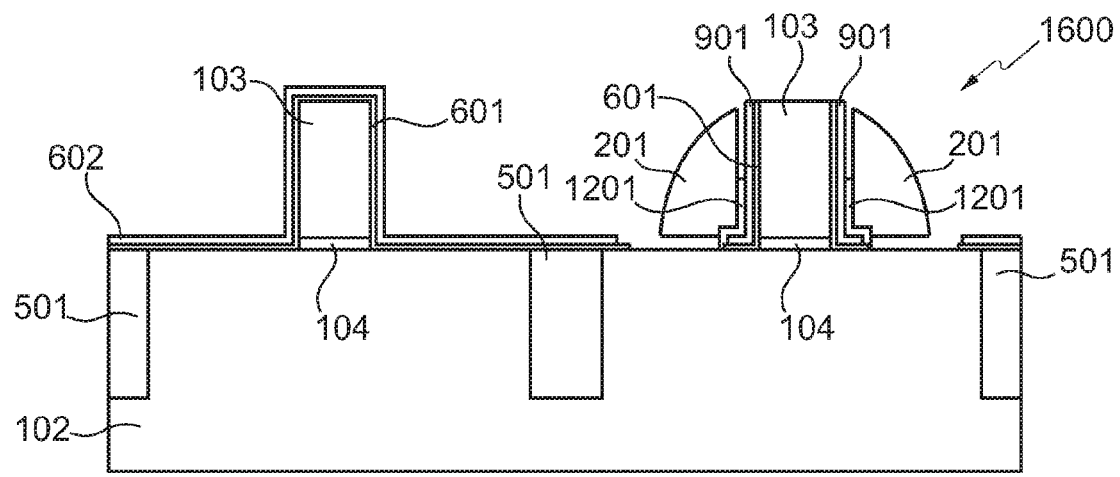

In order to obtain a layer sequence 1600 shown in FIG. 16, the resist 1502 is stripped, and a silicon oxide etch is performed to remove exposed portions of layer 1201.

Figure 17:
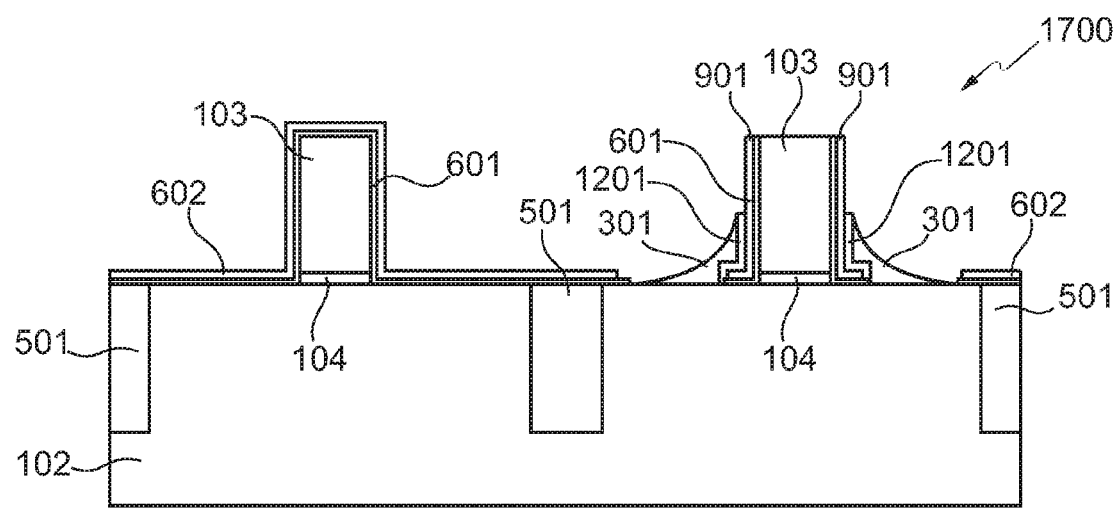

In order to obtain a layer sequence 1700 shown in FIG. 17, the layer sequence 1600 is made subject to a hydrogen anneal procedure to thereby rearrange the material of the convex spacer 201 to form a rearranged concave spacer 301.

Figure 18:
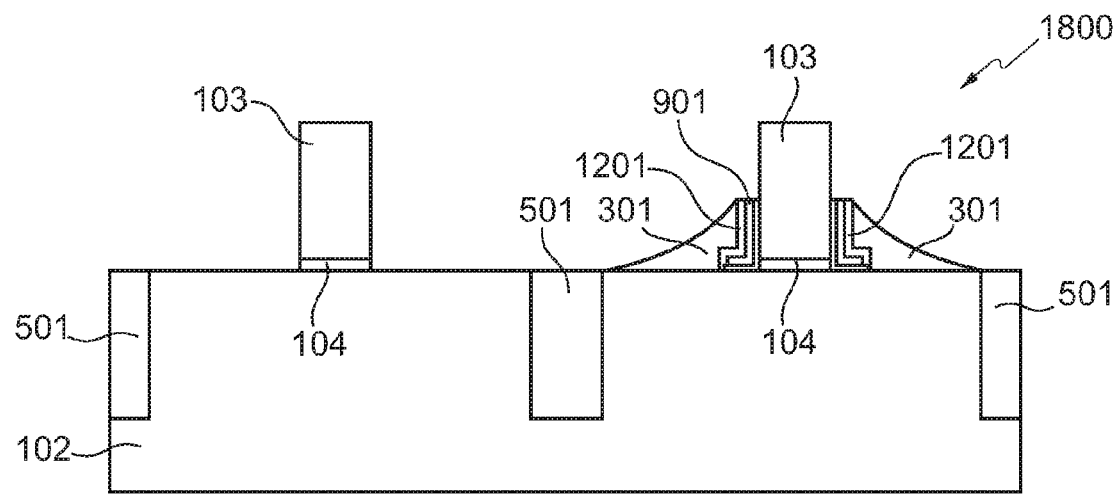

In order to obtain a layer sequence 1800 shown in FIG. 18, a silicon nitride etch and a silicon oxide etch may be performed to remove layers 602, 601 and portions of the remaining structures 901, 1201.

Figure 19:
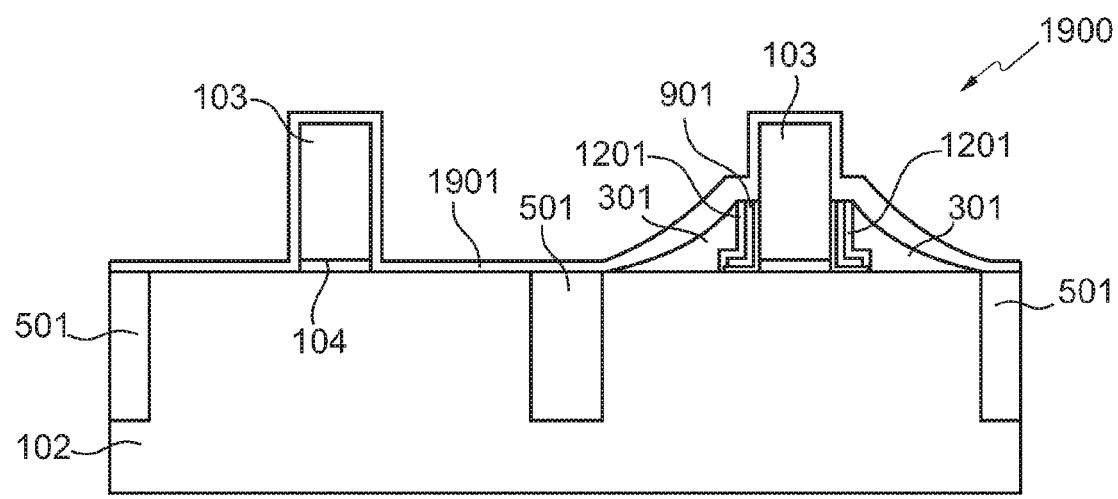

In order to obtain a layer sequence 1900 shown in FIG. 19, a silicon oxide deposition is performed to form a conformally deposited silicon oxide layer 1901.

Figure 20:
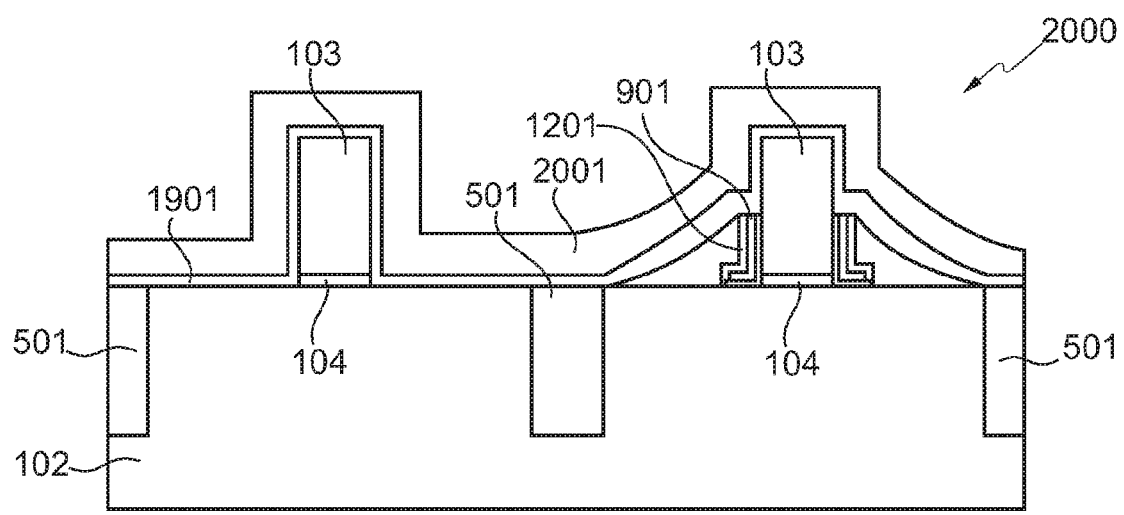

In order to obtain a layer sequence 2000 shown in FIG. 20, a silicon nitride deposition is performed in order to produce a silicon nitride layer 2001.

Figure 21:
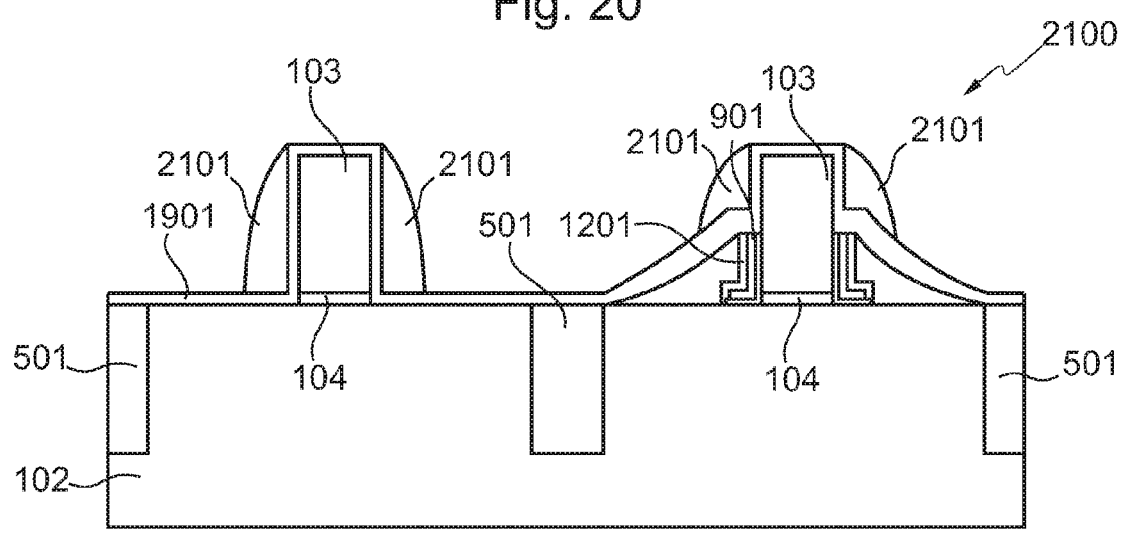

In order to obtain a layer sequence 2100 shown in FIG. 21, a silicon nitride etch is performed to produce the silicon nitride spacers 2101.

Figure 22:
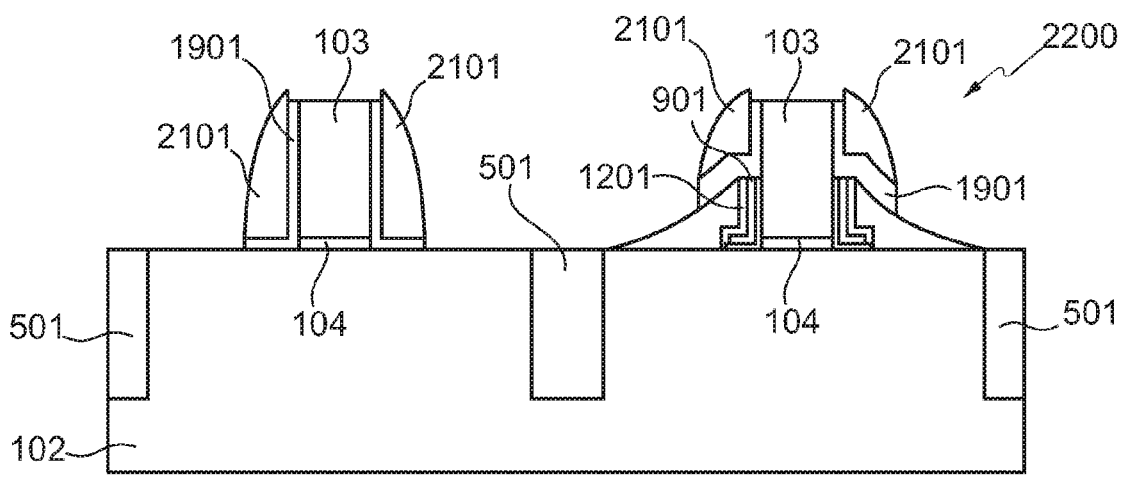

After having performed a silicon oxide etch, a layer sequence 2200 as shown in FIG. 22 is obtained including, on the right-hand side, a transistor according to an exemplary embodiment of the invention.

Regarding to the process integration scheme described referring to FIG. 5 to FIG. 22, important aspects of the described embodiment of the invention are implemented between the gate patterning of FIG. 5 and the further spacer formation of FIG. 19.

The process integration starts with the deposition of silicon oxide 601, silicon nitride 602 and amorphous silicon layer 603, as shown in FIG. 6. The silicon nitride layer 602 is used as a protective layer for mainstream CMOS, and the silicon nitride layer 602 is also used for the formation of the L-shaped spacer 901 for the dedicated transistors with an elevated source/drain. A mask 701 is used (see FIG. 7) in order to create a silicon spacer 801 (see FIG. 8). The resist 701 is stripped and silicon nitride 602 is etched (see FIG. 9). Only the silicon nitride 602 on the poly gate 103 and on the source/drain area is removed. The a-Si 603 is removed selectively to silicon nitride 602 and silicon oxide 601 (see FIG. 10). The remaining protective silicon oxide 601 on the source/drain and poly gate is removed (see FIG. 11), and a further silicon oxide layer 1201 (with accurate thickness) is deposited (see FIG. 12). The thickness of this silicon oxide layer 1201 may be rather important because it may determine the silicon oxide etch rate undercut in FIG. 16 and the sealing of the layer in FIG. 17. An amorphous SiGe layer 1301 is deposited (see FIG. 13), and SiGe spacers 201 are formed (see FIG. 14).

It may be advantageous (but not mandatory) to apply a short SiGe anisotropic etch (like APM, ammonia and hydrogen peroxide mixtures) in order to "recess" the SiGe spacers 201 such that the spacer height is lower than the poly gate 103. Unwanted SiGe spacers 201 may be etched away using a mask (see FIG. 15). An HF dip may be used in order to remove the silicon oxide layer 1201 underneath the SiGe spacer 201 (see FIG. 16). The SiGe spacers 201 are spread out using a hydrogen anneal (see FIG. 17). A typical hydrogen anneal is performed at 800° C., 10 Torr and one minute for a SiGe layer with a Germanium concentration around 30 at. %. The silicon-germanium layer 301 will recrystallize or have epitaxial realignment such that the interface is defect free. The silicon nitride spacer 2101 prevents the merging and/or the deformation of the poly gate 103. The protective silicon nitride layer 602 and silicon oxide layer 601 are removed (see FIG. 18), and CMOS processing is continued. The CMOS spacer formation is illustrated between FIG. 19 and FIG. 22.

The source/drain dopant engineering (not shown in FIG. 5 to FIG. 22) may be performed in different ways:

The silicon-germanium layer may be already doped before the silicon-germanium spacer formation. This can be done in situ or with implantation (in both cases a dedicated mask for the n- and p-type MOS devices may be required).

The silicon-germanium layer may be undoped and the source/drain regions are implanted after the raised source/drain formation.

A combination of the above two concepts is possible.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The words "comprising" and "comprises", and the like, do not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A method of manufacturing a transistor, the method comprising
   forming a gate on a substrate;
   forming a spacer on lateral side walls of the gate and on an adjacent portion of the substrate;
   modifying material of the spacer such that the modified spacer covers only a lower portion of the lateral side walls of the gate;
   providing source/drain regions in the modified spacer;
   wherein the modifying comprises rearranging the material of the spacer so that the rearranged spacer covers only a lower portion of the lateral side walls of the gate and an increased portion of the substrate.

2. The method of claim 1, comprising implanting the source/drain regions in the modified spacer.

3. The method of claim 1, comprising forming the source/drain regions in the modified spacer by making the modified spacer of a doped material.

4. The method of claim 1, wherein the rearranging comprises annealing.

5. The method of claim 4, wherein the annealing is hydrogen annealing.

6. The method of claim 1, wherein the modifying comprises etching back part of the material of the spacer.

7. The method of claim 1, comprising modifying the material of the spacer in such a manner that a thickness of the modified spacer gradually increases towards the gate.

8. The method of claim 1, comprising forming a protection structure, the protection structure being essentially L-shaped in a cross-sectional view, between the gate and the spacer.

9. The method of claim 1, comprising forming the spacer on the lateral side walls of the gate and on the adjacent portion of the substrate by
   depositing spacer material over the gate and the substrate; and
   removing part of the spacer material so that the spacer remains only on the lateral side walls of the gate and on the adjacent portion of the substrate.

* * * * *